(12) United States Patent
Sato et al.

(10) Patent No.: US 7,863,167 B2
(45) Date of Patent: Jan. 4, 2011

(54) METHOD OF MANUFACTURING GROUP III NITRIDE CRYSTAL

(75) Inventors: Fumitaka Sato, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/370,606

(22) Filed: Feb. 13, 2009

(65) Prior Publication Data
US 2009/0209091 A1    Aug. 20, 2009

(30) Foreign Application Priority Data
Feb. 14, 2008    (JP)    ............... 2008-033475

(51) Int. Cl.
  *H01L 21/00*    (2006.01)
(52) U.S. Cl. ............ 438/507; 438/508; 438/604; 438/609; 438/779; 257/E21.009; 257/E21.097; 257/E21.111; 257/E21.131; 257/E29.003
(58) Field of Classification Search ............ 438/507, 438/508, 604–609, 779; 257/E21.09, 97, 257/111–131, E29.003, E33.003
See application file for complete search history.

(56) References Cited

U.S. PATENT DOCUMENTS

| | | | | |
|---|---|---|---|---|
| 5,098,857 A | * | 3/1992 | Kuech et al. | 117/102 |
| 5,122,845 A | * | 6/1992 | Manabe et al. | 257/76 |
| 5,679,152 A | * | 10/1997 | Tischler et al. | 117/97 |
| 5,828,088 A | * | 10/1998 | Mauk | 257/98 |
| 6,218,280 B1 | * | 4/2001 | Kryliouk et al. | 438/607 |
| 6,627,552 B1 | * | 9/2003 | Nishio et al. | 438/694 |
| 6,656,269 B2 | * | 12/2003 | Tomioka | 117/89 |
| 6,692,568 B2 | * | 2/2004 | Cuomo et al. | 117/84 |
| 6,835,956 B1 | * | 12/2004 | Nagahama et al. | 257/79 |
| 6,852,253 B2 | * | 2/2005 | Tomioka | 264/1.21 |
| 6,860,943 B2 | * | 3/2005 | Koike et al. | 117/102 |
| 7,078,731 B2 | * | 7/2006 | D'Evelyn et al. | 257/94 |
| 7,125,801 B2 | * | 10/2006 | Minemoto et al. | 438/691 |
| 2001/0008656 A1 | | 7/2001 | Tischler et al. | |
| 2002/0195057 A1 | * | 12/2002 | Droopad et al. | 118/723 EB |
| 2005/0029539 A1 | * | 2/2005 | Toda et al. | 257/103 |
| 2009/0108407 A1 | * | 4/2009 | Motoki et al. | 257/609 |

FOREIGN PATENT DOCUMENTS

| | | |
|---|---|---|
| EP | 1041610 A1 | 10/2000 |
| EP | 1750311 A2 | 2/2007 |
| WO | WO-99-23693 A1 | 5/1999 |

* cited by examiner

*Primary Examiner*—Michael S Lebentritt
(74) *Attorney, Agent, or Firm*—James W. Judge

(57) ABSTRACT

Made available is a Group III nitride crystal manufacturing method whereby incidence of cracking in the III-nitride crystal when the III-nitride substrate is removed is kept to a minimum. III nitride crystal manufacturing method provided with: a step of growing, onto one principal face (10*m*) of a III-nitride substrate (10), III-nitride crystal (20) at least either whose constituent-atom type and ratios, or whose dopant type and concentration, differ from those of the III-nitride substrate (10); and a step of removing the III-nitride substrate (10) by vapor-phase etching.

5 Claims, 1 Drawing Sheet

US 7,863,167 B2

METHOD OF MANUFACTURING GROUP III NITRIDE CRYSTAL

BACKGROUND OF THE INVENTION

1. Technical Field

The present invention relates to methods of manufacturing Group III nitride crystal in which the occurrence of cracking has been reduced.

2. Description of the Related Art

Group III nitride crystal, which is ideally suited to various semiconductor devices including optoelectronic and electronic devices, is finding large-scale utilization. In the manufacture of such III-nitride crystal, various evaporation-deposition techniques—including hydride vapor-phase epitaxy (HVPE), metalorganic chemical vapor deposition (MOCVD), and sublimation—and various liquid-phase deposition techniques—including growth from solution and flux methods—are employed.

Therein, in order to obtain low-dislocation-density III-nitride crystal in bulk, the epitaxial growth, by an abovementioned technique, onto the principal face of a III-nitride substrate of III-nitride crystal whose constituent-atom type and ratios (that is, chemical composition) are the same as that of the III-nitride substrate, and either the slicing off the III-nitride crystal portion or the removal of the III-nitride substrate by grinding or polishing it away to yield a III-nitride crystal are carried out. (Cf., for example, Int'l./Japanese-Nat'l. App. Pub. No. WO99/23693 [Patent Document 1].)

If, however, the dopant type and concentration of III-nitride crystal grown onto the principal face of a III-nitride substrate are different from—even though the constituent-atom type and ratios are the same as—those of the III-nitride substrate, during post-crystal-growth mechanical processing when the III-nitride crystal portion is sliced off or the III-nitride substrate is removed by grinding or polishing it away, the III-nitride crystal is liable to become cracked. This is believed to be due to strain arising between the III-nitride substrate and the III-nitride crystal, owing to the thermal expansion coefficient and lattice constant in III-nitride substrate and in III-nitride crystal being different.

Furthermore, liquid-phase etching employing a strong acid such as phosphoric acid, or a strong base such as KOH, is ill-suited to III-nitride crystal, inasmuch as the etching speed is slow and the process selectivity is poor.

BRIEF SUMMARY OF THE INVENTION

An object of the present invention, in light of the foregoing, is to make available a Group III nitride crystal manufacturing method whereby incidence of cracking in the III-nitride crystal when the III-nitride substrate is removed is kept to a minimum.

The present invention is a Group III nitride crystal manufacturing method provided with: a step of growing, onto one of the principal faces of a III-nitride substrate, III-nitride crystal at least either whose constituent-atom type and ratios, or whose dopant type and concentration, differ from those of the III-nitride substrate; and a step of removing the III-nitride substrate by vapor-phase etching.

In a III nitride crystal manufacturing method involving the present invention, the vapor-phase etching can be carried out by spraying an etchant gas on the other of the principal faces of the III-nitride substrate. Further, the vapor-phase etching can employ as the etchant gas at least one gas selected from the group consisting of HCl gas, $Cl_2$ gas, and $H_2$ gas. In addition, it is possible to have the difference in the temperature for the III-nitride crystal growth and the etch temperature for the vapor-phase etching be 200° C. or less. Still further, it is possible to have the etch temperature in the vapor-phase etching be 700° C. or more.

The present invention controls incidence of cracking in III-nitride crystal in the removal of its III-nitride substrate, enabling the manufacture of III-nitride crystal with favorable yields.

With reference to FIG. 1, one mode of embodying a III nitride crystal manufacturing method involving the present invention provides: a step (FIG. 1A) of growing, onto one principal face 10m of a III-nitride substrate 10, III-nitride crystal 20 at least either whose constituent-atom type and ratios, or whose dopant type and concentration, differ from those of the III-nitride substrate 10; and a step (FIGS. 1B and 1C) of removing the III-nitride substrate 10 by vapor-phase etching. Removing the III-nitride substrate 10 by vapor-phase etching minimizes incidence of cracking in the III-nitride crystal 20 in the removal of the III-nitride substrate 10.

Herein, in order completely to remove the III-nitride substrate 10, as well as in order to remove a portion 20e of the III-nitride crystal, initially grown onto the III-nitride substrate 10, where the crystallinity is poor, together with the removal of the III-nitride substrate 10, the portion 20e of the III-nitride crystal (for example, the portion from its interface with the substrate to a fixed thickness) can be removed.

Again, at least either the constituent-atom type and ratios, or the dopant type and concentration, of the III-nitride crystal 20 grown onto the one principal face 10m of the III-nitride substrate 10 are different from those of the III-nitride substrate 10. Consequently, with the thermal expansion coefficient and the lattice constant of the III-nitride substrate 10 differing from the thermal expansion coefficient and the lattice constant of the III-nitride crystal 20, strain between the III-nitride substrate and the III-nitride crystal occurs when the III-nitride crystal is grown, and when the III-nitride crystal cools after being grown.

In that situation, when mechanical processing operations such as slicing off the III-nitride crystal and removing the III-nitride substrate by grinding and/or polishing it away are carried out, cracking in the III-nitride crystal is liable to occur, owing to the mechanical load on the III-nitride crystal. Instead, carrying out removal of the III-nitride substrate by vapor-phase etching curbs cracking in the III-nitride crystal to a minimum, inasmuch as no mechanical load is placed on the III-nitride crystal. What is more, because vapor-phase etching is carried out not at room temperature (e.g., 25° C.), but at a temperature near the crystal-growth temperature, etching can be done in a state in which strain between the III-nitride substrate and III-nitride crystal is low, to further control cracking in the III-nitride crystal.

Furthermore, when mechanical processing operations such as slicing off the III-nitride crystal and removing the III-nitride substrate by grinding and/or polishing it away are carried out, a thickness of processing damage forms along the processed surface of the III-nitride crystal. If removal of the III-nitride substrate is carried out by vapor-phase etching instead, no process-damaged layer will form on the III-nitride crystal.

Also, inasmuch as mechanical processing of III-nitride crystal on III-nitride substrates—manufacturing operations such as slicing off the crystal and grinding and/or polishing away the substrate—is carried out at or near room temperature, the operations are done with there being considerable warpage in the III-nitride substrate and III-nitride crystal. If removal of the III-nitride substrate is instead carried out by vapor-phase etching, at a temperature near the crystal-growth temperature, the etching will be done with there being slight warpage in the III-nitride substrate and III-nitride crystal, such that post-etching warpage in the III-nitride crystal will be minimal.

Vapor etching in the present invention is not particularly limited as long as it can remove the III-nitride substrate 10, but from the perspective of etching efficiently, it is preferably done by the spraying of an etchant gas on the other principal face 10*n* of the III-nitride substrate 10.

In addition, the vapor-phase etching preferably employs as the etchant gas a gas selected from the group consisting of HCl gas, $Cl_2$ gas, and $H_2$ gas. This is because these gases are capable of efficiently etching III-nitride crystal.

Another preferable condition in the present embodying mode is that the difference in the temperature for the III-nitride crystal growth and the etch temperature for the vapor-phase etching be 200° C. or less. If the difference between the crystal-growth temperature and the vapor-phase etching temperature surpasses 200° C., strain between the III-nitride substrate and III-nitride crystal that arises due to the difference between the thermal expansion coefficient of the III-nitride substrate and the thermal expansion coefficient of the III-nitride crystal becomes so serious as to be prohibitive of curbing the occurrence of cracking in the III-nitride crystal. From that standpoint, the difference between the crystal-growth temperature and the vapor-phase etching temperature more preferably is 100° C. or less, and still more preferably is 50° C. or less.

Also in the present embodying mode, from the standpoint of carrying out the vapor-phase etching efficiently, it is preferable that the etch temperature be 700° C. or more, more preferable that it be 900° C. or more, and still more preferable that it be 1100° C. or more.

BRIEF DESCRIPTION OF THE SEVERAL VIEWS OF THE DRAWINGS

FIG. 1 is outline sectional diagrams for illustrating one embodiment of a III-nitride crystal manufacturing method involving the present invention, wherein

Figure 1A:
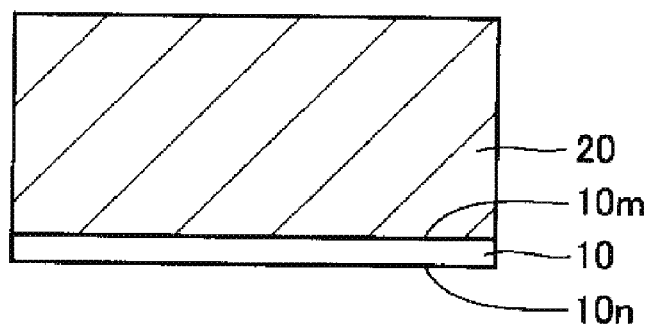
FIG. 1A is representative of a process step whereby III-nitride crystal is grown onto one of the principal faces of a III-nitride substrate.

In the figure, reference numeral 10 indicates the III-nitride substrate; reference numerals 10*m* and 10*n*, the principal faces; reference numeral 20, the III-nitride crystal; reference numeral 20*e*, the one portion of the III-nitride crystal; and reference mark E, the etchant gas.

DETAILED DESCRIPTION OF THE INVENTION

Embodiment 1

1. III-Nitride Crystal Growth Step

Figure 1A:
Figure 1B:
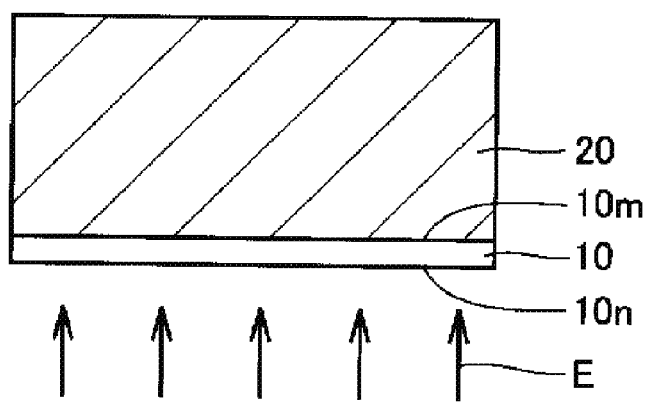
FIGS. 1B and 1C are representative of process steps whereby the III-nitride substrate and a portion of the III-nitride crystal are removed.
Figure 1B:
Figure 1C:
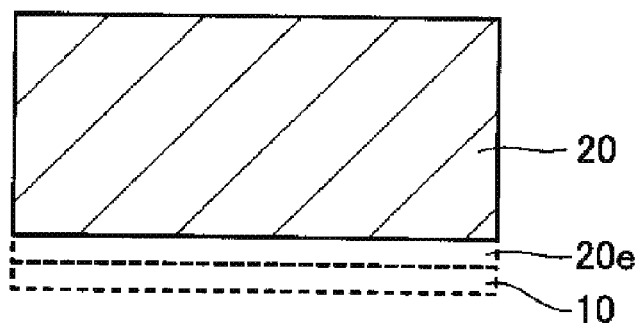

Reference is made to FIG. 1: Onto one principal face 10*m* of a GaN substrate (Group III nitride substrate 10) of 5.08 cm (2-inch) diameter and 400 μm thickness, GaN crystal (III-nitride crystal 20) of 2100 μm thickness, doped with $7 \times 10^{18}$ $cm^{-3}$ O atoms, was grown by HVPE. In this process, the GaN crystal growth temperature was let be 1050° C.; the partial pressure of Ga chloride gas, which was the Group III precursor gas, was let be 1 kPa; the partial pressure of $NH_3$ gas, which was the nitrogen precursor gas, was let be 10 kPa; and the partial pressure of $O_2$ gas, which was the dopant source gas, was let be 0.2 Pa. It should be noted that all of the III-nitride substrates employed in the present embodiment and comparative examples were substrates whose dopant type was oxygen and whose dopant concentration was $4 \times 10^{18}$ $cm^{-3}$. And in the doping of the III-nitride crystal, O, Si, Fe or C was employed for the dopant type, the partial pressure of the dopant gas was controlled to be within the range of from 0.2 Pa to 50 Pa, and the dopant concentration within the crystal was made to be within the range of from $5 \times 10^{17}$ $cm^{-3}$ to $2 \times 10^{19}$ $cm^{-3}$.

2. III-Nitride Substrate Removal Step

HCl gas (etchant gas E) was sprayed onto the other principal face 10*n* of the GaN substrate (III-nitride substrate 10) onto the one principal face 10*m* of which the GaN crystal (III-nitride crystal 20) had been grown, to remove by vapor-phase etching the 400-μm-thick GaN substrate and a portion of the GaN crystal (a section thereof from its interface with the substrate to a thickness of 100 μm), yielding a GaN crystal of 2000 μm thickness. In this process, the etch temperature was let be 950° C., and the etch time was let be 150 minutes.

In respect of 100 GaN crystal samples obtained by the same process steps as detailed above, the process-damaged layer thickness (meaning the average thickness among the 100 crystal samples, with the same being the case in the following embodiments and comparative examples) was 0 μm, distortion in the crystal (meaning the average distortion among the 100 crystal samples, with the same being the case in the following embodiments and comparative examples) was 5 μm, and the incidence of cracking was 12%. Herein, the thickness of the process-damaged layer was obtained by measuring, in a cathodoluminescence (CL) section through the crystal, the layer thickness to which the surface was non-emitting. Meanwhile, the extent of distortional bowing in the crystals was found from their radius of curvature, which was calculated from the distribution of off-angled crystallographic axes in the crystals, characterized by X-ray diffraction. Furthermore, the cracking incidence was given in percentages as the proportion of crystals, among the total crystal samples, in which cracking arose. "Crystals in which cracking arose" means crystals in which a linear surface fracture of 2.0 mm or greater length had occurred, or crystals in which three or more linear surface fractures of 0.5 mm to 2.0 mm had occurred, or crystals in which twenty-one or more linear surface fractures of 0.3 mm to 0.5 mm had occurred. The results are tabulated in Table I.

COMPARATIVE EXAMPLE 1

1. III-Nitride Crystal Growth Step

In the same manner as in Embodiment 1, oxygen-doped GaN crystal was grown onto one of the principal faces of a GaN substrate.

2. III-Nitride Substrate Removal Step

Along the other principal face of the GaN substrate onto the one principal face of which the GaN crystal had been grown, grinding with a #500 polishing head (SiC polishing head) into which was embedded SiC grit (35 μm average grain size) was carried out to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 10 μm, warpage in the crystal was 35 μm, and the cracking incidence was 85%. Consequently, using the present GaN crystal as semiconductor device substrates would further require removal of the process-damaged layer. The results are tabulated in Table I.

COMPARATIVE EXAMPLE 2

1. III-Nitride Crystal Growth Step

In the same manner as in Embodiment 1, oxygen-doped GaN crystal was grown onto one of the principal faces of a GaN substrate.

2. III-Nitride Substrate Removal Step

Along the other principal face of the GaN substrate onto the one principal face of which the GaN crystal had been grown, polishing with a slurry containing diamond grit of 10 μm average grain size was carried out to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 3 μm, warpage in the crystal was 15 μm, and the cracking incidence was 25%. Consequently, using the present GaN crystal as semiconductor device substrates would further require removal of the process-damaged layer. The results are tabulated in Table I.

COMPARATIVE EXAMPLE 3

1. III-Nitride Crystal Growth Step

In the same manner as in Embodiment 1, oxygen-doped GaN crystal was grown onto one of the principal faces of a GaN substrate.

2. III-Nitride Substrate Removal Step

A wire saw having a diamond-electrodeposited wire blade of 0.3 mm diameter was employed to slice the GaN crystal grown onto the one principal face of the GaN substrate, in a plane parallel to the GaN substrate principal face, whereby the 400-μm-thick GaN substrate and a portion of the GaN crystal (a section thereof from its interface with the substrate to a thickness of 500 μm) was removed, yielding four GaN crystal of 400 μm thickness. In respect of 100 GaN crystal samples obtained by the same process steps as just detailed, the process-damaged layer thickness was 12 μm, warpage in the crystal was 30 μm, and the cracking incidence was 45%. Consequently, using the present GaN crystals as semiconductor device substrates would further require removal of the process-damaged layer. The results are tabulated in Table I.

Embodiment 2

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from having the etch temperature be 750° C., and the etch time be 200 minutes, etching was done in the same manner as in Embodiment 1, to remove the 400-μm-thick GaN substrate and a portion of the GaN crystal (a section thereof from its interface with the substrate to a thickness of 150 μm), yielding a GaN crystal of 1950 μm thickness. In respect of 100 GaN crystal samples obtained by the same process steps as just detailed, the process-damaged layer thickness was 0 μm, warpage in the crystal was 3 μm, and the cracking incidence was 10%. The results are tabulated in Table I.

TABLE I

| | | Comp. Ex. 1 | Comp. Ex. 2 | Comp. Ex. 3 | Embod. Ex. 1 | Embod. Ex. 2 |
|---|---|---|---|---|---|---|
| Substrate | Constituent-atom type & ratios | GaN | GaN | GaN | GaN | GaN |
| | Diameter (cm) | 5.08 | 5.08 | 5.08 | 5.08 | 5.08 |
| | Thickness (μm) | 400 | 400 | 400 | 400 | 400 |
| Crystal growth | Constituent-atom type & ratios | GaN | GaN | GaN | GaN | GaN |
| | Dopant type | O | O | O | O | O |
| | Dopant conc. (cm$^{-3}$) | $7 \times 10^{18}$ | $7 \times 10^{18}$ | $7 \times 10^{18}$ | $7 \times 10^{18}$ | $7 \times 10^{18}$ |
| | Growth temp. (° C.) | 1050 | 1050 | 1050 | 1050 | 1050 |
| | Growth thickness (μm) | 2100 | 2100 | 2100 | 2100 | 2100 |
| Removal of substrate and portion of crystal | Removal method | Grinding | Polishing | Slicing | Vapor-phase etching | Vapor-phase etching |
| | Etchant gas | — | — | — | HCl | HCl |
| | Etch temp. (° C.) | — | — | — | 950 | 750 |
| | Etch time (min) | — | — | — | 150 | 200 |
| | Removal thickness (μm) Substrate | 400 | 400 | 400 | 400 | 400 |
| | Removal thickness (μm) Crystal | 100 | 100 | 500 | 100 | 150 |
| | Post-removal crystal thickness (μm) | 2000 | 2000 | 400 × 4 | 2000 | 1950 |
| | Process-damaged layer thickness (μm) | 10 | 3 | 12 | 0 | 0 |
| | Warpage in crystal (μm) | 35 | 15 | 30 | 5 | 3 |
| | Cracking incidence (%) | 85 | 25 | 45 | 12 | 10 |

TABLE I-continued

|  | Comp. Ex. 1 | Comp. Ex. 2 | Comp. Ex. 3 | Embod. Ex. 1 | Embod. Ex. 2 |
|---|---|---|---|---|---|
| Notes | Process-damaged layer removal required | Process-damaged layer removal required | Process-damaged layer removal required | | |

Reference is made to Table 1: With III-nitride crystal whose III-nitride substrate was removed by the mechanical operations of grinding, polishing, or slicing, thickness of the process-damaged layer, warpage in the crystal, and incidence of cracking were each extensive (Comparative Examples 1 through 3). In contrast, with III-nitride crystal whose III-nitride substrate was removed by vapor-phase etching employing HCl as the etchant gas, the process-damaged layer thickness was 0 μm, while warpage in the crystal and incidence of cracking were each minimal.

Embodiment 3

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from having the etch temperature be 1050° C., and the etch time be 60 minutes, etching was done in the same manner as in Embodiment 1, to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 0 μm, warpage in the crystal was 5 μm, and the cracking incidence was 9%. The results are tabulated in Table II.

Embodiment 4

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from having the etch temperature be 1150° C., and the etch time be 30 minutes, etching was done in the same manner as in Embodiment 1, to remove the 400-μm-thick GaN substrate and a portion of the GaN crystal (a section thereof from its interface with the substrate to a thickness of 300 μm), yielding a GaN crystal of 1800 μm thickness.

In respect of 100 GaN crystal samples obtained by the same process steps as just detailed, the process-damaged layer thickness was 0 μm, warpage in the crystal was 6 μm, and the cracking incidence was 4%. The results are tabulated in Table II.

Embodiment 5

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from having the etch temperature be 1250° C., and the etch time be 10 minutes, etching was done in the same manner as in Embodiment 1, to remove the 400-μm-thick GaN substrate and a portion of the GaN crystal (a section thereof from its interface with the substrate to a thickness of 350 μm), yielding a GaN crystal of 1750 μm thickness.

In respect of 100 GaN crystal samples obtained by the same process steps as just detailed, the process-damaged layer thickness was 0 μm, warpage in the crystal was 6.5 μm, and the cracking incidence was 5%. The results are tabulated in Table II.

Embodiment 6

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from having the etch temperature be 1000° C., and the etch time be 150 minutes, etching was done in the same manner as in Embodiment 1, to remove the 400-μm-thick GaN substrate and a portion of the GaN crystal (a section thereof from its interface with the substrate to a thickness of 300 μm), yielding a GaN crystal of 1800 μm thickness. In respect of 100 GaN crystal samples obtained by the same process steps as just detailed, the process-damaged layer thickness was 0 μm, warpage in the crystal was 2.5 μm, and the cracking incidence was 7%. The results are tabulated in Table II.

Embodiment 7

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from having the etch temperature be 1050° C., and the etch time be 150 minutes, etching was done in the same manner as in Embodiment 1, to remove the 400-μm-thick GaN substrate and a portion of the GaN crystal (a section thereof from its interface with the substrate to a thickness of 700 μm), yielding a GaN crystal of 1400 μm thickness. In respect of 100 GaN crystal samples obtained by the same process steps as just detailed, the process-damaged layer thickness was 0 μm, warpage in the crystal was 6 μm, and the cracking incidence was 3%. The results are tabulated in Table II.

TABLE II

|  |  | Embod. Ex. 3 | Embod. Ex. 4 | Embod. Ex. 5 | Embod. Ex. 6 | Embod. Ex. 7 |
|---|---|---|---|---|---|---|
| Substrate | Constituent-atom type & ratios | GaN | GaN | GaN | GaN | GaN |
|  | Diameter (cm) | 5.08 | 5.08 | 5.08 | 5.08 | 5.08 |
|  | Thickness (μm) | 400 | 400 | 400 | 400 | 400 |
| Crystal growth | Constituent-atom type & ratios | GaN | GaN | GaN | GaN | GaN |
|  | Dopant type | O | O | O | O | O |
|  | Dopant conc. (cm$^{-3}$) | $7 \times 10^{18}$ | $7 \times 10^{18}$ | $7 \times 10^{18}$ | $7 \times 10^{18}$ | $7 \times 10^{18}$ |
|  | Growth temp. (° C.) | 1050 | 1050 | 1050 | 1050 | 1050 |
|  | Growth thickness (μm) | 2100 | 2100 | 2100 | 2100 | 2100 |
| Removal of substrate and portion of crystal | Removal method | Vapor-phase etching | Vapor-phase etching | Vapor-phase etching | Vapor-phase etching | Vapor-phase etching |
|  | Etchant gas | HCl | HCl | HCl | HCl | HCl |
|  | Etch temp. (° C.) | 1050 | 1150 | 1250 | 1000 | 1050 |
|  | Etch time (min) | 60 | 30 | 10 | 150 | 150 |
|  | Removal thickness (μm) Substrate | 400 | 400 | 400 | 400 | 400 |
|  | Crystal | 100 | 300 | 350 | 300 | 700 |
|  | Post-removal crystal thickness (μm) | 2000 | 1800 | 1750 | 1800 | 1400 |
|  | Process-damaged layer thickness (μm) | 0 | 0 | 0 | 0 | 0 |
|  | Warpage in crystal (μm) | 5 | 6 | 6.5 | 2.5 | 6 |
|  | Cracking incidence (%) | 9 | 4 | 5 | 7 | 3 |
| Notes |  |  |  |  |  |  |

Reference is made to Table I and Table II: The smaller was the difference in temperature between the temperature in the III-nitride crystal growth and the etch temperature in the vapor-phase etching, and the larger was the substrate- and crystal-removal thickness, the more reduced was the cracking incidence. Meanwhile, in the vapor-phase etching, the higher the etch temperature was, the higher was the etching speed (Embodiments 1 through 7).

Embodiment 8

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from employing $H_2$ gas as the etchant gas, and from having the etch temperature be 1050° C., and the etch time be 200 minutes, etching was done in the same manner as in Embodiment 1, to remove the 400-μm-thick GaN substrate and a portion of the GaN crystal (a section thereof from its interface with the substrate to a thickness of 1100 μm), yielding a GaN crystal of 1000 μm thickness. In respect of 100 GaN crystal samples obtained by the same process steps as just detailed, the process-damaged layer thickness was 0 μm, warpage in the crystal was 6.8 μm, and the cracking incidence was 8%. The results are tabulated in Table III.

Embodiment 9

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from employing $Cl_2$ gas as the etchant gas, and from having the etch temperature be 950° C., and the etch time be 150 minutes, etching was done in the same manner as in Embodiment 1, to remove the 400-μm-thick GaN substrate and a portion of the GaN crystal (a section thereof from its interface with the substrate to a thickness of 150 μm), yielding a GaN crystal of 1950 μm thickness. In respect of 100 GaN crystal samples obtained by the same process steps as just detailed, the process-damaged layer thickness was 0 μm, warpage in the crystal was 3 μm, and the cracking incidence was 10%. The results are tabulated in Table III.

Embodiment 10

1. III-Nitride Crystal Growth Step

In the same manner as in Embodiment 1, oxygen-doped GaN crystal was grown onto one of the principal faces of a GaN substrate.

2. III-Nitride Substrate Removal Step

Apart from employing $Cl_2$ gas as the etchant gas, and from having the etch temperature be 1000° C., and the etch time be 150 minutes, etching was done in the same manner as in Embodiment 1, to remove the 400-μm-thick GaN substrate and a portion of the GaN crystal (a section thereof from its interface with the substrate to a thickness of 320 μm), yielding a GaN crystal of 1780 μm thickness. In respect of 100 GaN crystal samples obtained by the same process steps as just detailed, the process-damaged layer thickness was 0 μm, warpage in the crystal was 5 μm, and the cracking incidence was 9%. The results are tabulated in Table III.

TABLE III

|  |  | Embod. Ex. 8 | Embod. Ex. 9 | Embod. Ex. 10 |
|---|---|---|---|---|
| Substrate | Constituent-atom type & ratios | GaN | GaN | GaN |
|  | Diameter (cm) | 5.08 | 5.08 | 5.08 |
|  | Thickness (μm) | 400 | 400 | 400 |
| Crystal growth | Constituent-atom type & ratios | GaN | GaN | GaN |
|  | Dopant type | O | O | O |
|  | Dopant conc. (cm$^{-3}$) | 7 × 10$^{18}$ | 7 × 10$^{18}$ | 7 × 10$^{18}$ |
|  | Growth temp. (° C.) | 1050 | 1050 | 1050 |
|  | Growth thickness (μm) | 2100 | 2100 | 2100 |
| Removal of substrate and portion of crystal | Removal method | Vapor-phase etching | Vapor-phase etching | Vapor-phase etching |
|  | Etchant gas | H$_2$ | Cl$_2$ | Cl$_2$ |
|  | Etch temp. (° C.) | 1050 | 950 | 1000 |
|  | Etch time (min) | 200 | 150 | 150 |
|  | Removal thickness (μm) Substrate | 400 | 400 | 400 |
|  | Removal thickness (μm) Crystal | 1100 | 150 | 320 |
|  | Post-removal crystal thickness (μm) | 1000 | 1950 | 1780 |
|  | Process-damaged layer thickness (μm) | 0 | 0 | 0 |
|  | Warpage in crystal (μm) | 6.8 | 3 | 5 |
|  | Cracking incidence (%) | 8 | 10 | 9 |
| Notes |  |  |  |  |

Reference is made to Table III: In implementations in which H$_2$ or Cl$_2$ was employed as the etchant gas, III-nitride crystal of slight warpage, with 0 μm process-damaged-layer thickness and a low cracking incidence could also be obtained.

Embodiment 11

1. III-Nitride Crystal Growth Step

Apart from controlling the partial pressure of the O$_2$ gas so that the crystal would be doped with 2×10$^{19}$ cm$^{-3}$ O atoms, GaN crystal (III-nitride crystal 20) of 2100 μm thickness was grown in the same manner as in Embodiment 1.

2. III-Nitride Substrate Removal Step

Etching was done in the same manner as in Embodiment 1, to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 0 μm, warpage in the crystal was 5 μm, and the cracking incidence was 18%. The results are tabulated in Table IV.

Embodiment 12

1. III-Nitride Crystal Growth Step

Apart from employing SiCl$_4$ gas whose partial pressure was controlled so that the crystal would be doped with 2×10$^{18}$ cm$^{-3}$ Si atoms, GaN crystal (III-nitride crystal 20) of 2100 μm thickness was grown in the same manner as in Embodiment 1.

2. III-Nitride Substrate Removal Step

Etching was done in the same manner as in Embodiment 1, to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness (average thickness) was 0 μm, warpage in the crystal (average warpage) was 5 μm, and the cracking incidence was 7%. The results are tabulated in Table IV.

Embodiment 13

1. III-Nitride Crystal Growth Step

Apart from employing Cp$_2$Fe bis-cyclopentadienyl iron gas whose partial pressure was controlled so that the crystal would be doped with 8×10$^{17}$ cm$^{-3}$ Fe atoms, GaN crystal (III-nitride crystal 20) of 2100 μm thickness was grown in the same manner as in Embodiment 1.

2. III-Nitride Substrate Removal Step

Etching was done in the same manner as in Embodiment 1, to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 0 μm, warpage in the crystal was 5 μm, and the cracking incidence was 12%. The results are tabulated in Table IV.

Embodiment 14

1. III-Nitride Crystal Growth Step

Apart from employing CH$_4$ gas whose partial pressure was controlled so that the crystal would be doped with 5×10$^{17}$ cm$^{-3}$ C atoms, GaN crystal (III-nitride crystal 20) of 2100 μm thickness was grown in the same manner as in Embodiment 1.

2. III-Nitride Substrate Removal Step

Etching was done in the same manner as in Embodiment 1, to remove the 400-μm-thick GaN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 0 μm, warpage in the crystal was 5 μm, and the cracking incidence was 12%. The results are tabulated in Table IV.

TABLE IV

|  |  | Embod. Ex. 11 | Embod. Ex. 12 | Embod. Ex. 13 | Embod. Ex. 14 |
|---|---|---|---|---|---|
| Substrate | Constituent-atom type & ratios | GaN | GaN | GaN | GaN |
|  | Diameter (cm) | 5.08 | 5.08 | 5.08 | 5.08 |
|  | Thickness (μm) | 400 | 400 | 400 | 400 |

TABLE IV-continued

|  |  | Embod. Ex. 11 | Embod. Ex. 12 | Embod. Ex. 13 | Embod. Ex. 14 |
|---|---|---|---|---|---|
| Crystal growth | Constituent-atom type & ratios | GaN | GaN | GaN | GaN |
|  | Dopant type | O | Si | Fe | C |
|  | Dopant conc. (cm$^{-3}$) | $2 \times 10^{19}$ | $2 \times 10^{18}$ | $8 \times 10^{17}$ | $5 \times 10^{17}$ |
|  | Growth temp. (° C.) | 1050 | 1050 | 1050 | 1050 |
|  | Growth thickness (μm) | 2100 | 2100 | 2100 | 2100 |
| Removal of substrate and portion of crystal | Removal method | Vapor-phase etching | Vapor-phase etching | Vapor-phase etching | Vapor-phase etching |
|  | Etchant gas | HCl | HCl | HCl | HCl |
|  | Etch temp. (° C.) | 950 | 950 | 950 | 950 |
|  | Etch time (min) | 150 | 150 | 150 | 150 |
|  | Removal thickness (μm) Substrate | 400 | 400 | 400 | 400 |
|  | Crystal | 100 | 100 | 100 | 100 |
|  | Post-removal crystal thickness (μm) | 2000 | 2000 | 2000 | 2000 |
|  | Process-damaged layer thickness (μm) | 0 | 0 | 0 | 0 |
|  | Warpage in crystal (μm) | 5 | 5 | 5 | 5 |
|  | Cracking incidence (%) | 18 | 7 | 12 | 12 |
| Notes |  |  |  |  |  |

Reference is made to Table IV: In implementations in which the dopant type and concentration differed, III-nitride crystal of slight warpage, with 0 μm process-damaged-layer thickness and a low cracking incidence could also be obtained.

Embodiment 15

1. III-Nitride Crystal Growth Step

Reference is made to FIG. 1: Onto one principal face 10m of an AlN substrate (Group III nitride substrate 10) of 5.08 cm (2-inch) diameter and 400 μm thickness, AlN crystal (III-nitride crystal 20) of 2100 μm thickness, doped with $7 \times 10^{18}$ cm$^{-3}$ O atoms, was grown by HVPE. In this process, the AlN crystal growth temperature was let be 1350° C.; the partial pressure of Al chloride gas, which was the Group III precursor gas, was let be 1 kPa; and the partial pressure of NH$_3$ gas, which was the nitrogen precursor gas, was let be 10 kPa.

2. III-Nitride Substrate Removal Step

Apart from employing Cl$_2$ gas as the etchant gas, and from having the etch temperature be 1400° C., and the etch time be 60 minutes, etching was done in the same manner as in Embodiment 1, to remove the 400-μm-thick AlN substrate and a portion of the AlN crystal (a section thereof from its interface with the substrate to a thickness of 250 μm), yielding an AlN crystal of 1850 μm thickness. In respect of 100 AlN crystal samples obtained by the same process steps as just detailed, the process-damaged layer thickness was 0 μm, warpage in the crystal was 6.5 μm, and the cracking incidence was 15%. The results are tabulated in Table V.

Embodiment 16

1. III-Nitride Crystal Growth Step

Reference is made to FIG. 1: Onto one principal face 10m of an AlN substrate (Group III nitride substrate 10) of 5.08 cm (2-inch) diameter and 400 μm thickness, GaN crystal (III-nitride crystal 20) of 2100 μm thickness, doped with $7 \times 10^{18}$ cm$^{-3}$ O atoms, was grown by HVPE. In this process, the GaN crystal growth temperature was let be 1350° C.; the partial pressure of Ga chloride gas, which was the Group III precursor gas, was let be 4 kPa; and the partial pressure of NH$_3$ gas, which was the nitrogen precursor gas, was let be 10 kPa.

2. III-Nitride Substrate Removal Step

Apart from employing Cl$_2$ gas as the etchant gas, etching was done in the same manner as in Embodiment 1, to remove the 400-μm-thick AlN substrate and a portion of the GaN crystal (a section thereof from its interface with the substrate to a thickness of 100 μm), yielding a GaN crystal of 2000 μm thickness. In respect of 100 GaN crystal samples obtained by the same process steps as just detailed, the process-damaged layer thickness was 0 μm, warpage in the crystal was 5 μm, and the cracking incidence was 15%. The results are tabulated in Table V.

Embodiment 17

1. III-Nitride Crystal Growth Step

Reference is made to FIG. 1: Onto one principal face 10m of an AlN substrate (Group III nitride substrate 10) of 5.08 cm (2-inch) diameter and 400 μm thickness, Al$_{0.25}$Ga$_{0.75}$N crystal (III-nitride crystal 20) of 2100 μm thickness, doped with $7 \times 10^{18}$ cm$^{-3}$ O atoms, was grown by HVPE. In this process, the Al$_{0.25}$Ga$_{0.75}$N crystal growth temperature was let be 1250° C.; the partial pressure of Al chloride gas and the partial pressure of Ga chloride gas, which were the Group III precursor gases, were let be 250 Pa and 750 Pa, respectively; and the partial pressure of NH$_3$ gas, which was the nitrogen precursor gas, was let be 10 kPa.

2. III-Nitride Substrate Removal Step

Apart from employing Cl$_2$ gas as the etchant gas, and from having the etch temperature be 1400° C., and the etch time be 60 minutes, etching was done in the same manner as in Embodiment 1, to remove the 400-μm-thick AlN substrate and a portion of the Al$_{0.25}$Ga$_{0.75}$N crystal (a section thereof from its interface with the substrate to a thickness of 250 μm), yielding an Al$_{0.25}$Ga$_{0.75}$N crystal of 1850 μm thickness. In respect of 100 $Al_{0.25}Ga_{0.75}N$ crystal samples obtained by the same process steps as just detailed, the process-damaged layer thickness was 0 μm, warpage in the crystal was 6.5 μm, and the cracking incidence was 15%. The results are tabulated in Table V.

Embodiment 18

1. III-Nitride Crystal Growth Step

Reference is made to FIG. 1: Onto one principal face 10*m* of an GaN substrate (Group III nitride substrate 10) of 5.08 cm (2-inch) diameter and 400 μm thickness, $Al_{0.25}Ga_{0.75}N$ crystal (III-nitride crystal 20) of 2100 μm thickness, doped with $7 \times 10^{18}$ $cm^{-3}$ O atoms, was grown by HVPE. In this process, the $Al_{0.25}Ga_{0.75}N$ crystal growth temperature was let be 1150° C.; the partial pressure of Al chloride gas and the partial pressure of Ga chloride gas, which were the Group III precursor gases, were let be 250 Pa and 750 Pa, respectively; and the partial pressure of $NH_3$ gas, which was the nitrogen precursor gas, was let be 10 kPa.

2. III-Nitride Substrate Removal Step

Etching was done in the same manner as in Embodiment 1, to remove the 400-μm-thick GaN substrate and a portion of the $Al_{0.25}Ga_{0.75}N$ crystal (a section thereof from its interface with the substrate to a thickness of 100 μm), yielding an $Al_{0.25}Ga_{0.75}N$ crystal of 2000 μm thickness. In respect of 100 $Al_{0.25}Ga_{0.75}N$ crystal samples obtained by the same process steps as just detailed, the process-damaged layer thickness was 0 μm, warpage in the crystal was 5 μm, and the cracking incidence was 15%. The results are tabulated in Table V.

a GaN substrate and $Al_{0.25}Ga_{0.75}N$ crystal, III-nitride crystal of slight warpage, with 0 μm process-damaged-layer thickness and a low cracking incidence could also be obtained.

It should be understood that in the embodiments and comparative examples described in the foregoing, in order to clear away the III-nitride substrate completely and yield III-nitride crystal of high crystallinity, the III-nitride substrate was removed together with a portion of the III-nitride crystal, but of course it is adequate to remove simply the III-nitride substrate alone.

The presently disclosed modes of embodying and embodiment examples should in all respects be considered to be illustrative and not limiting. The scope of the present invention is set forth not by the foregoing description but by the scope of the patent claims, and is intended to include meanings equivalent to the scope of the patent claims and all modifications within the scope.

What is claimed is:

1. A Group III nitride crystal manufacturing method comprising:
   a step of growing, onto one of the principal faces of a III-nitride substrate, III-nitride crystal differing from the III-nitride substrate in terms of at least one property selected from constituent-atom type, constituent-atom ratio, dopant type and dopant concentration; and
   a step of removing the III-nitride substrate together with a portion of the III-nitride crystal by vapor-phase etching.

2. A Group III nitride crystal manufacturing method as set forth in claim 1, wherein the vapor-phase etching is carried out by spraying an etchant gas on the other of the principal faces of the III-nitride substrate.

TABLE V

|  |  | Embod. Ex. 15 | Embod. Ex. 16 | Embod. Ex. 17 | Embod. Ex. 18 |
|---|---|---|---|---|---|
| Substrate | Constituent-atom type & ratios | AlN | AlN | AlN | GaN |
|  | Diameter (cm) | 5.08 | 5.08 | 5.08 | 5.08 |
|  | Thickness (μm) | 400 | 400 | 400 | 400 |
| Crystal growth | Constituent-atom type & ratios | AlN | GaN | $Al_{0.25}Ga_{0.75}N$ | $Al_{0.25}Ga_{0.75}N$ |
|  | Dopant type | O | O | O | O |
|  | Dopant conc. ($cm^{-3}$) | $7 \times 10^{18}$ | $7 \times 10^{18}$ | $7 \times 10^{18}$ | $7 \times 10^{18}$ |
|  | Growth temp. (° C.) | 1350 | 1350 | 1250 | 1150 |
|  | Growth thickness (μm) | 2100 | 2100 | 2100 | 2100 |
| Removal of substrate and portion of crystal | Removal method | Vapor-phase etching | Vapor-phase etching | Vapor-phase etching | Vapor-phase etching |
|  | Etchant gas | $Cl_2$ | $Cl_2$ | $Cl_2$ | HCl |
|  | Etch temp. (° C.) | 1400 | 950 | 1400 | 950 |
|  | Etch time (min) | 60 | 150 | 60 | 150 |
|  | Removal thickness (μm) Substrate | 400 | 400 | 400 | 400 |
|  | Crystal | 250 | 100 | 250 | 100 |
|  | Post-removal crystal thickness (μm) | 1850 | 2000 | 1850 | 2000 |
|  | Process-damaged layer thickness (μm) | 0 | 0 | 0 | 0 |
|  | Warpage in crystal (μm) | 6.5 | 5 | 6.5 | 5 |
|  | Cracking incidence (%) | 15 | 15 | 15 | 15 |
| Notes |  |  |  |  |  |

Reference is made to Table V: In implementations in which the III-nitride substrate and III-nitride crystal combination was an AlN substrate and AlN crystal, or an AlN substrate and GaN crystal, or an AlN substrate and $Al_{0.25}Ga_{0.75}N$ crystal, or 3. A Group III nitride crystal manufacturing method as set forth in claim 1, wherein the vapor-phase etching employs as the etchant gas at least one gas selected from the group consisting of HCl gas, $Cl_2$ gas, and $H_2$ gas.

4. A Group III nitride crystal manufacturing method as set forth in claim 1, wherein the difference in the temperature for the III-nitride crystal growth and the etch temperature for the vapor-phase etching is 200° C. or less.

5. A Group III nitride crystal manufacturing method as set forth in claim 1, where in the etch temperature in the vapor-phase etching is 700° C. or more.

\* \* \* \* \*